US006605504B1

(12) United States Patent
JaiPrakash et al.

(10) Patent No.: US 6,605,504 B1
(45) Date of Patent: Aug. 12, 2003

(54) METHOD OF MANUFACTURING CIRCUIT WITH BURIED STRAP INCLUDING A LINER

(75) Inventors: Venkatachalam C. JaiPrakash, Sunnyvale, CA (US); Rajiv Ranade, Brewster, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/186,043

(22) Filed: Jun. 28, 2002

(51) Int. Cl.[7] .................. H01L 21/8242; H01L 21/20
(52) U.S. Cl. .................. 438/243; 438/244; 438/248; 438/386; 438/387; 438/391
(58) Field of Search .................. 438/243, 244, 438/248, 386, 387, 391

(56) References Cited

U.S. PATENT DOCUMENTS

| 6,063,657 A | 5/2000 | Bronner et al. ............ 438/244 |
| 6,066,527 A | 5/2000 | Kudelka et al. ............ 438/243 |
| 6,127,215 A | 10/2000 | Joachim et al. ............ 438/224 |
| 6,177,698 B1 | 1/2001 | Gruening et al. ............ 257/302 |
| 6,184,091 B1 | 2/2001 | Gruening et al. ............ 438/270 |
| 6,200,851 B1 | 3/2001 | Arnold ............ 438/243 |
| 6,242,310 B1 | 6/2001 | Divakaruni et al. ........ 436/268 |
| 6,326,275 B1 | 12/2001 | Harrington et al. ......... 438/386 |
| 2003/0013259 A1 * | 1/2003 | Chidambarrao et al. .... 438/301 |

OTHER PUBLICATIONS

"Short–Channel Vertical Sidewall MOSFETs", Thomas Schulz, Wolfgang Rosner, Lothar Risch, Adam Korbel, Ulrich Langmann, IEEE Transactions On Electron Devices, vol. 48, No. 8, Aug. 2001.

* cited by examiner

Primary Examiner—Olik Chaudhuri
Assistant Examiner—William M. Brewster
(74) Attorney, Agent, or Firm—Lerner, David, Littenberg, Krumholz & Mentlik, LLP

(57) ABSTRACT

Semiconductor devices having trenches with buried straps therein preventing lateral out-diffusion of dopant are provided along with methods of fabricating such semiconductor devices.

11 Claims, 18 Drawing Sheets

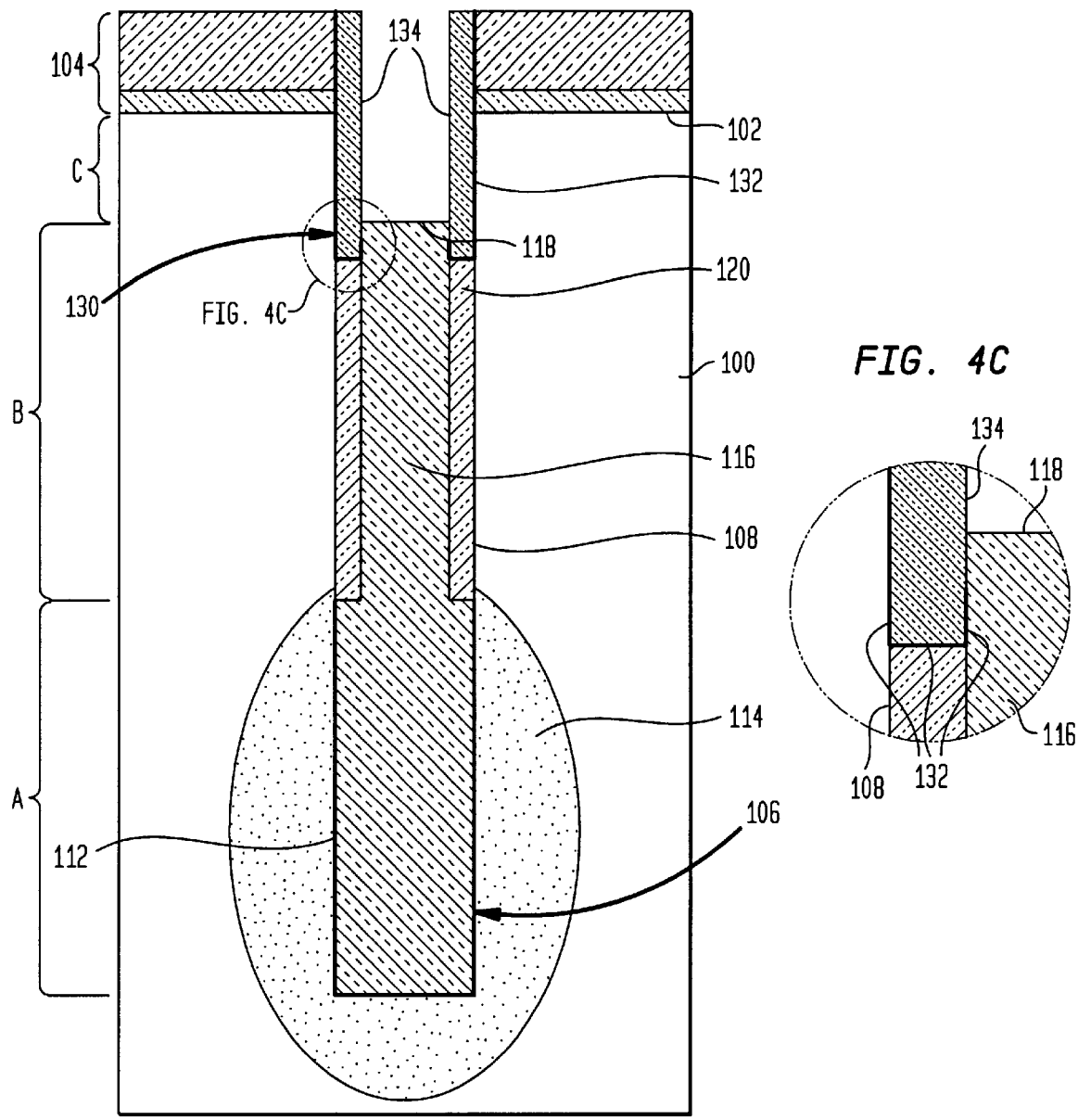

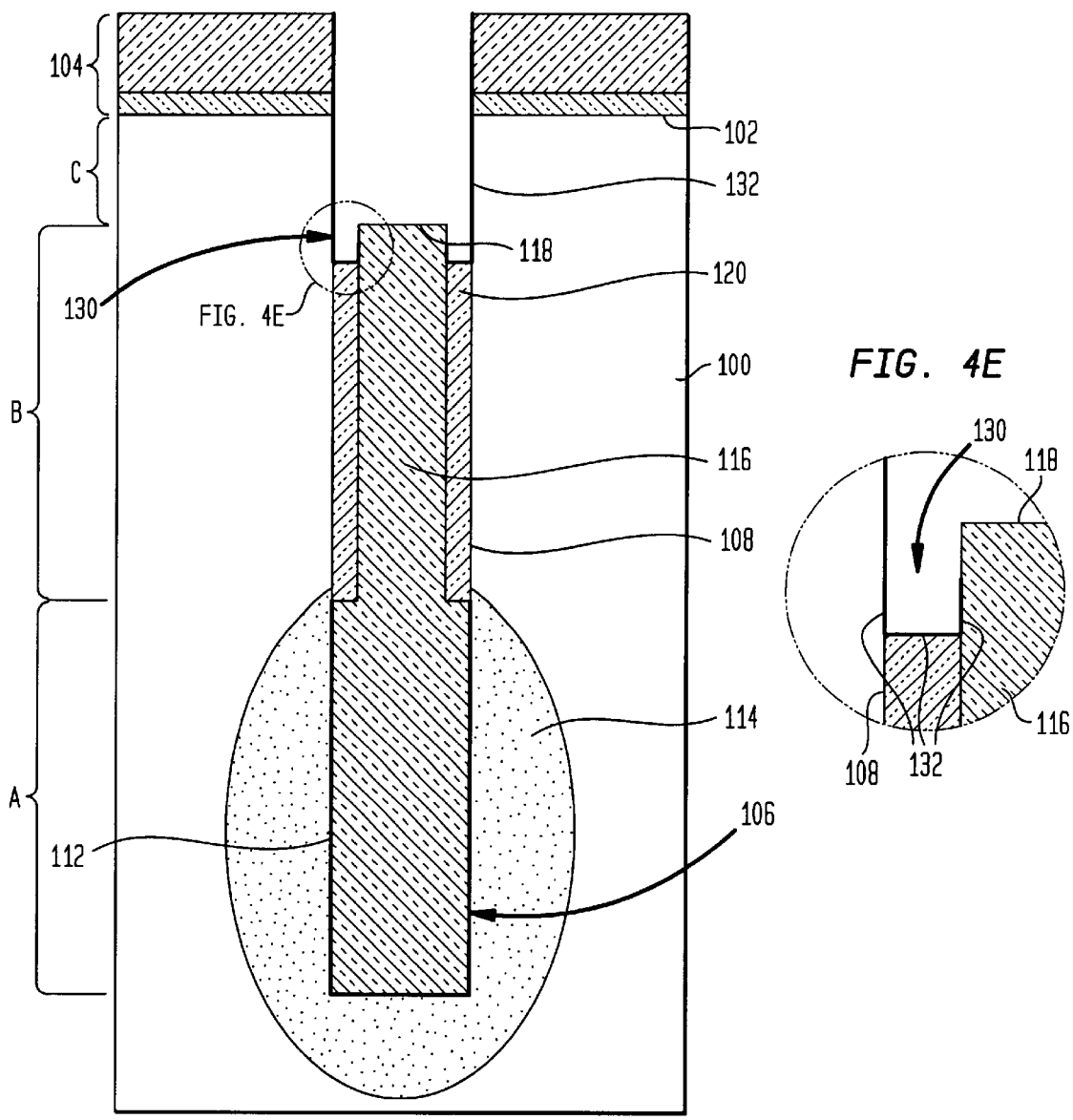

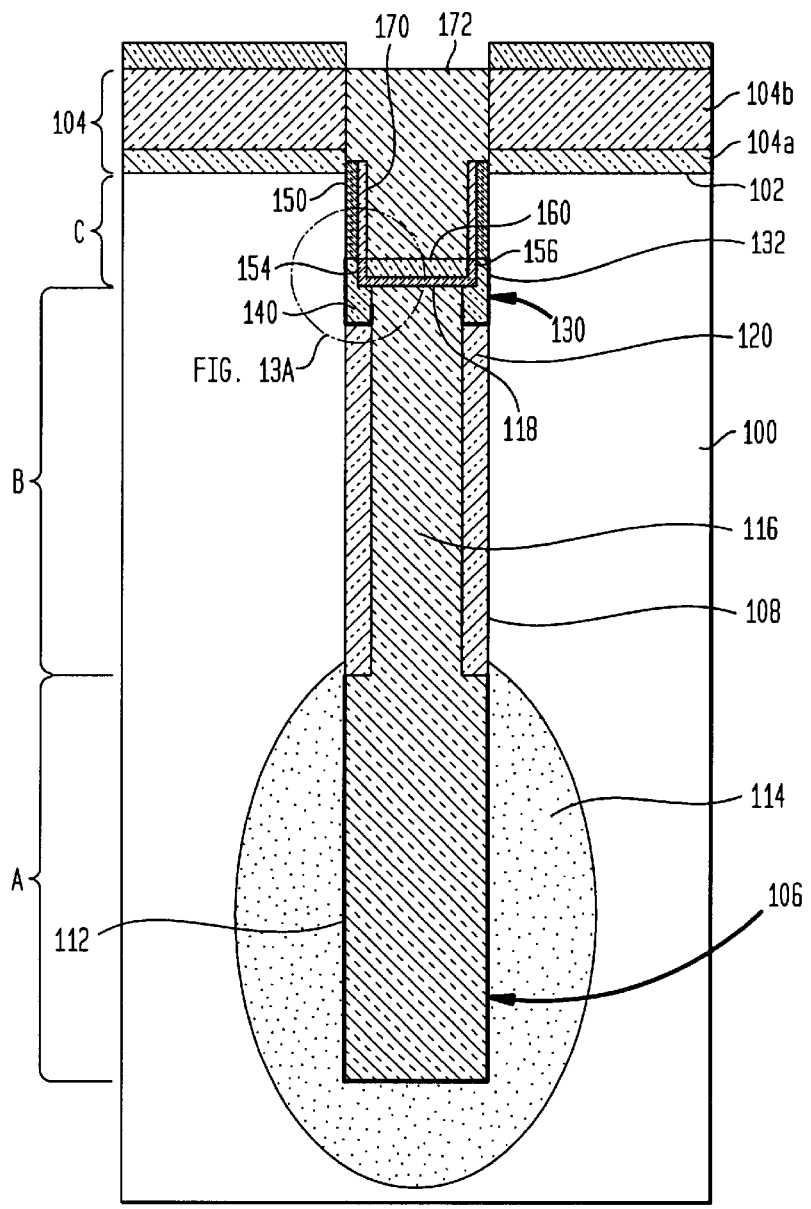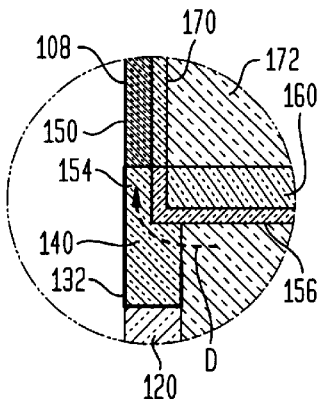

METHOD OF MANUFACTURING CIRCUIT WITH BURIED STRAP INCLUDING A LINER

BACKGROUND OF THE INVENTION

Semiconductor devices are employed in many types of equipment to perform a wide variety of applications. An important type of semiconductor device for use in the memory field is known as dynamic random access memory ("DRAM"). DRAM is extensively used for memory in computers. A basic DRAM cell may include a capacitor and a transistor formed in a semiconductor substrate. The capacitor stores a charge representing data. The transistor allows the data to be refreshed, read from, or written to the capacitor. By reducing the surface area of the capacitor or the transistor, more DRAM cells can fit onto a chip. The increase in the amount of DRAM cells results in greater memory capacity for the chip.

One method of minimizing the surface area of a DRAM cell or other memory cell is to vertically construct the components (i.e., where a semiconductor device includes components formed at several or more layers thereof). One way to accomplish such vertical construction may involve forming a trench in a semiconductor substrate. For example, polysilicon ("poly-Si") may be deposited in the trench. A recess may be created in the poly-Si by removing a portion of the poly-Si through an etching process. Layers of conductive, semiconductive and/or insulating material can then be deposited in the recessed area of the poly-Si. The steps of etching the poly-Si and depositing new material can be repeated until the desired components are formed.

A compact DRAM cell can be formed by stacking the capacitor and the transistor within the trench. For instance, the trench may be etched or otherwise formed in the substrate. The capacitor may be formed in the bottom portion of the trench. Next, an isolation material such as a trench top oxide ("TTO") may be formed over the capacitor. Adjacent to the TTO is a "buried strap." The transistor is formed on top of the TTO and the buried strap. The TTO isolates the transistor gate from the capacitor. The buried strap is the contact between the transistor and the capacitor and comprises a material such as doped polysilicon. The dopant may be arsenic, phosphorous, boron or another suitable material. The buried strap may also act as the source or drain of the transistor.

Such stacked memory devices ("vertical memory cells") can occupy less surface area compared to planar memory cells (e.g., where the transistor and capacitor are side by side) or diagonal memory cells (e.g., where the capacitor is formed in the trench and the transistor is adjacent to the surface of the trench). Thus, vertical memory cells may be placed very close together. While increasing the memory cell density, and hence increasing the memory capacity of a chip, the closeness of vertical memory cells may be problematic.

Closely spaced vertical memory cells may interfere with each other because the dopant of the buried strap tends to diffuse out into the substrate. Typically, diffusion occurs in both vertical and horizontal directions. Vertical diffusion (e.g., diffusion in a direction parallel to the sidewalls of the trench) may improve the contact between the transistor and the capacitor of one vertical memory cell. However, when the dopant from one vertical memory cell diffuses horizontally into the substrate (e.g, diffusion in a direction perpendicular to the sidewalls of the trench), the dopant may come into contact either with the diffused dopant from a nearby vertical memory cell or a portion of the nearby cell itself. This contact may create "cross-talk" between the transistors of the nearby vertical memory cells. Cross-talk occurs when a signal from one device is inadvertently received by another device. In this situation, cross-talk may interfere with a transistor's ability to read to or write data from the capacitor to which it is attached, rendering one or both vertical memory cells nonfunctional. Therefore, there is a need for vertical memory cells having minimized buried strap horizontal out-diffusion.

SUMMARY OF THE INVENTION

The present invention provides a buried strap with reduced out-diffusion for use in stacked memory cells and a method of fabricating the buried strap.

In accordance with an embodiment of the present invention, a semiconductor device comprises a semiconductor substrate with a trench formed therein. The trench includes a sidewall. A capacitor is formed in the trench. The capacitor includes a node dielectric lining a portion of the sidewall. A buried plate is disposed in the semiconductor substrate adjacent to the node dielectric. Capacitor fill material is disposed within the trench. An insulator is disposed over at least a part of the capacitor fill material. The semiconductor device also includes a transistor, which has a source, a gate and a drain formed of a buried strap. The gate is disposed at least partly over the insulator and connects to the source. The buried strap is adjacent to the insulator and acts to connect the gate to the capacitor fill material. The buried strap includes a liner and a strap fill material. The liner reduces diffusion of the dopant in a direction substantially perpendicular to the sidewall while allowing diffusion of the dopant in a direction substantially parallel to the sidewall. Preferably, the liner is at least 22 Å thick.

In accordance with another embodiment, a semiconductor device includes a trench formed in a semiconductor substrate. The trench has a sidewall defining lower, middle and upper regions. The semiconductor device also includes a capacitor. The capacitor has a capacitor fill material comprising polysilicon and a dopant. The fill material is formed within the lower and middle regions of the trench. The semiconductor device also includes a transistor partly disposed within the upper region of the trench. An insulator is disposed on top of the capacitor. The insulator is operable to provide isolation between the capacitor and the transistor. The semiconductor device also includes a buried strap. The buried strap includes a nitride liner and a strap fill material. The buried strap is operable to function as a drain of the transistor and is operable to connect the transistor to the capacitor. The nitride liner prevents diffusion of the dopant in a direction substantially perpendicular to the sidewall. Preferably, the buried strap is formed within a divot disposed proximate to the insulator, the capacitor fill material and the sidewall.

A method of fabricating a semiconductor device of the present invention may comprise forming a trench in a semiconductor substrate, forming a collar along a sidewall of the trench, and forming a capacitor. The capacitor includes a capacitor fill material having a dopant. The capacitor fill material is formed in a region of the trench. The collar may be recessed to form a divot, wherein a top portion of the collar is below a top surface of the capacitor fill material. A buried strap may be formed within the divot. The dopant is operable to diffuse in a direction substantially parallel to the sidewall. Preferably the liner has a first side disposed adjacent to the sidewall and a bottom connected to the first side and disposed over the top portion of the collar.

Another method of fabricating a semiconductor device of the present invention may comprise forming a trench in the semiconductor substrate. The trench has a sidewall defining lower, middle and upper regions. The method forms a node dielectric along the sidewall in the lower region of the trench. A collar is formed along the sidewall in the middle and upper regions of the trench. The lower and middle regions are substantially filled with a capacitor fill material, which comprises polysilicon and a dopant. The capacitor fill material has a top surface. A top portion of the collar is etched below the top surface of the capacitor fill material to form a divot. A nitride liner is deposited within the divot. The nitride liner has a thickness of at least about 22 Å. A strap fill material is formed within the nitride liner. The strap fill material and the nitride liner form a buried strap. The nitride liner permits diffusion of the dopant in a direction substantially parallel to the sidewall. Preferably the method includes filling the divot with a spacer after depositing the nitride liner, then etching the spacer from the divot, and removing part of the nitride liner.

In accordance with another embodiment, a semiconductor device includes a trench formed in a semiconductor substrate. The trench has a sidewall. The semiconductor device also includes a capacitor. The capacitor has a capacitor fill material comprising polysilicon and a dopant. The fill material is formed within the trench. The semiconductor device also includes a transistor at least partly disposed within the trench. An insulator is disposed on top of the capacitor. The insulator is operable to provide isolation between the capacitor and the transistor. The semiconductor device also includes a buried strap. The buried strap includes a liner and a strap fill material. The buried strap is operable to provide connectivity between the capacitor and the transistor. The semiconductor device also includes a layer of epitaxial silicon disposed on the sidewall. The layer of epitaxial silicon is adjacent to the strap fill material and the insulator. The layer of epitaxial silicon covers defects in the sidewall created during fabrication of the semiconductor device. Preferably, a gate oxide is grown on the layer of epitaxial silicon.

The semiconductor device of the present invention and the methods of fabricating a semiconductor device of the present invention provide a buried strap with reduced horizontal out-diffusion. The buried strap may be used in vertical memory cells and other semiconductor devices where diffusion can be problematic. The reduced out-diffusion permits devices to be placed closer together, thereby increasing memory capacity. The foregoing aspects, features and advantages of the present invention will be further appreciated when considered with reference to the following description of the preferred embodiments and accompanying drawings.

BRIEF DESCRIPTION OF THE DRAWINGS

FIGS. 4A–E are schematic cross-sectional views of a semiconductor substrate after additional steps in a process in accordance with an aspect of the invention.

FIGS. 13 and 13A are schematic cross-sectional views illustrating the result of another step in a process of forming a semiconductor device of the present invention.

DETAILED DESCRIPTION

Figure 1:
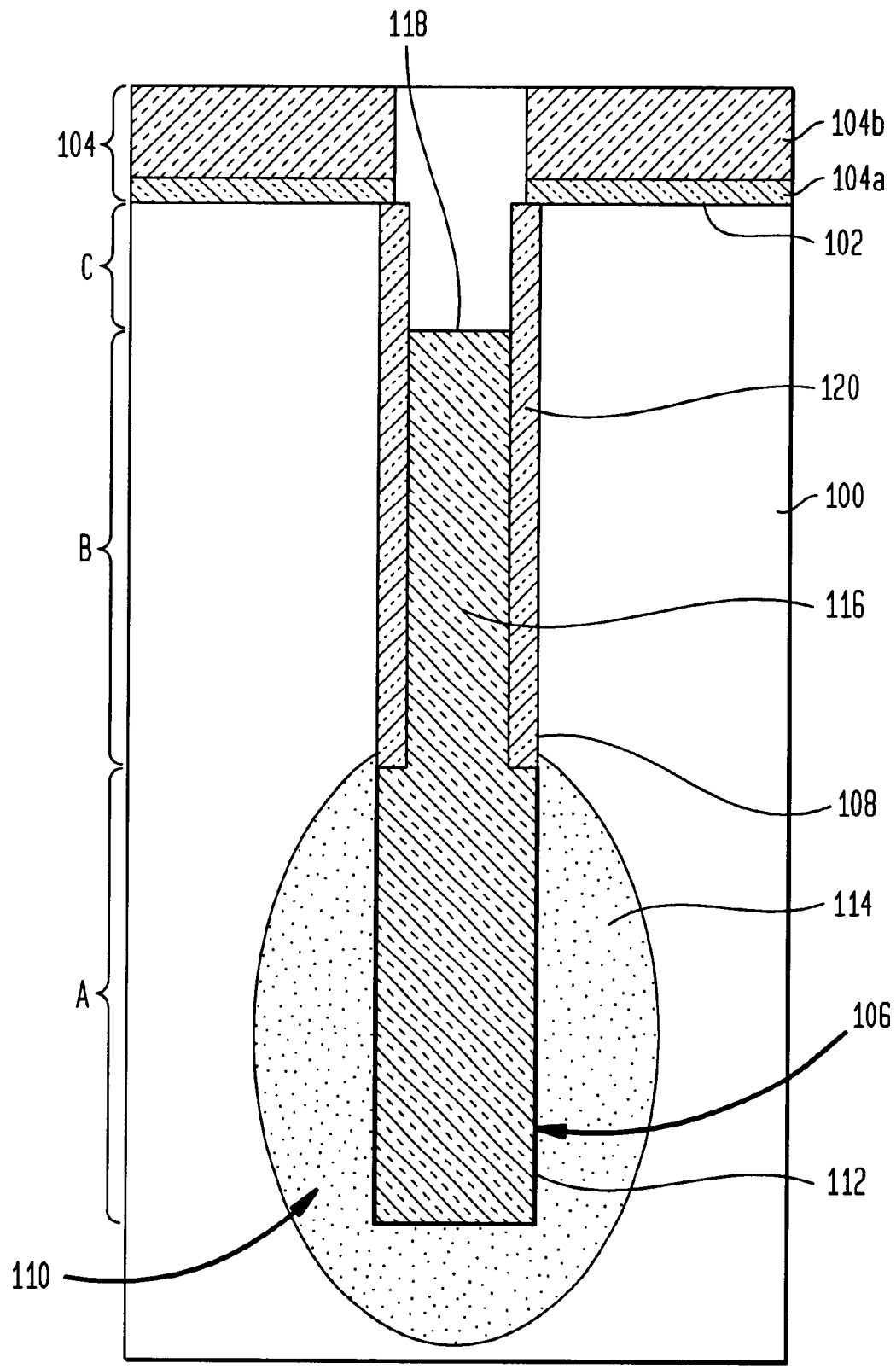
FIG. 1 is a schematic cross-sectional view of a semiconductor substrate after a step in a process in accordance with an aspect of the invention.

FIG. 1 is a schematic cross-sectional illustration of a semiconductor substrate 100 at a step in a process of fabricating a vertical memory cell having direction out-diffusion in accordance with one aspect of the present invention. The substrate 100 is preferably silicon ("Si"), but various other substrates 100 may be employed, including but not limited to gallium arsenide ("GaAs"), indium phosphide ("InP"), and silicon carbide ("SiC").

Substrate 100 has a substrate surface 102 with a pad stack 104 formed thereon. The pad stack 104 includes multiple layers of material used in later steps of fabricating a vertical memory cell. Preferably, the pad stack 104 includes a pad oxide 104a and a pad nitride 104b. The vertical memory cell is fabricated in a trench 106. The trench 106 may be formed in the substrate 100 by an etching process, such as Reactive Ion Etching ("RIE") or wet etching. The trench 106 is defined by sidewalls 108. The sidewalls 108 may extend from the bottom of the trench 106 in a lower region A through a middle region B and an upper region C to the substrate surface 102.

A capacitor 110 is formed in the lower region A and middle region B. The capacitor 110 preferably includes a dielectric liner 112 (commonly known as a "node dielectric"), a buried plate 114 and a capacitor fill material 116. The node dielectric 112 is preferably disposed along the sidewalls 108 within the lower region A. The node dielectric 112 separates the two plates of the capacitor 110. Node dielectric 112 may be, for example, an oxide, a nitride or a series of layers of oxide and nitride. One plate of the capacitor comprises a portion of the substrate 100, and is the buried plate 114. Buried plate 114 may be doped by ion implantation or another process. The other plate of the capacitor 110 comprises the capacitor fill material 116 disposed within the lower and middle regions A, B. The capacitor fill material 116 may be, for example, doped poly-Si or another suitable material. Preferably, the poly-Si is doped with arsenic. The capacitor fill material 116 may be formed by deposition or other well-known processes.

As shown in FIG. 1, capacitor fill material 116 has a top surface 118. At this stage in the process of fabricating a vertical memory cell, the top surface 118 is situated at the juncture of the middle region B and upper region C. Also shown in FIG. 1 is a collar 120 that preferably lines the sidewalls 108 in the middle and upper regions B, C. The collar 120 provides isolation for a top portion of the capacitor fill material 116, preventing parasitic leakage currents from other components from discharging the capacitor 110. Collar 120 is preferably an oxide, which may be formed by oxidation, deposition or other processes.

Figure 2A:
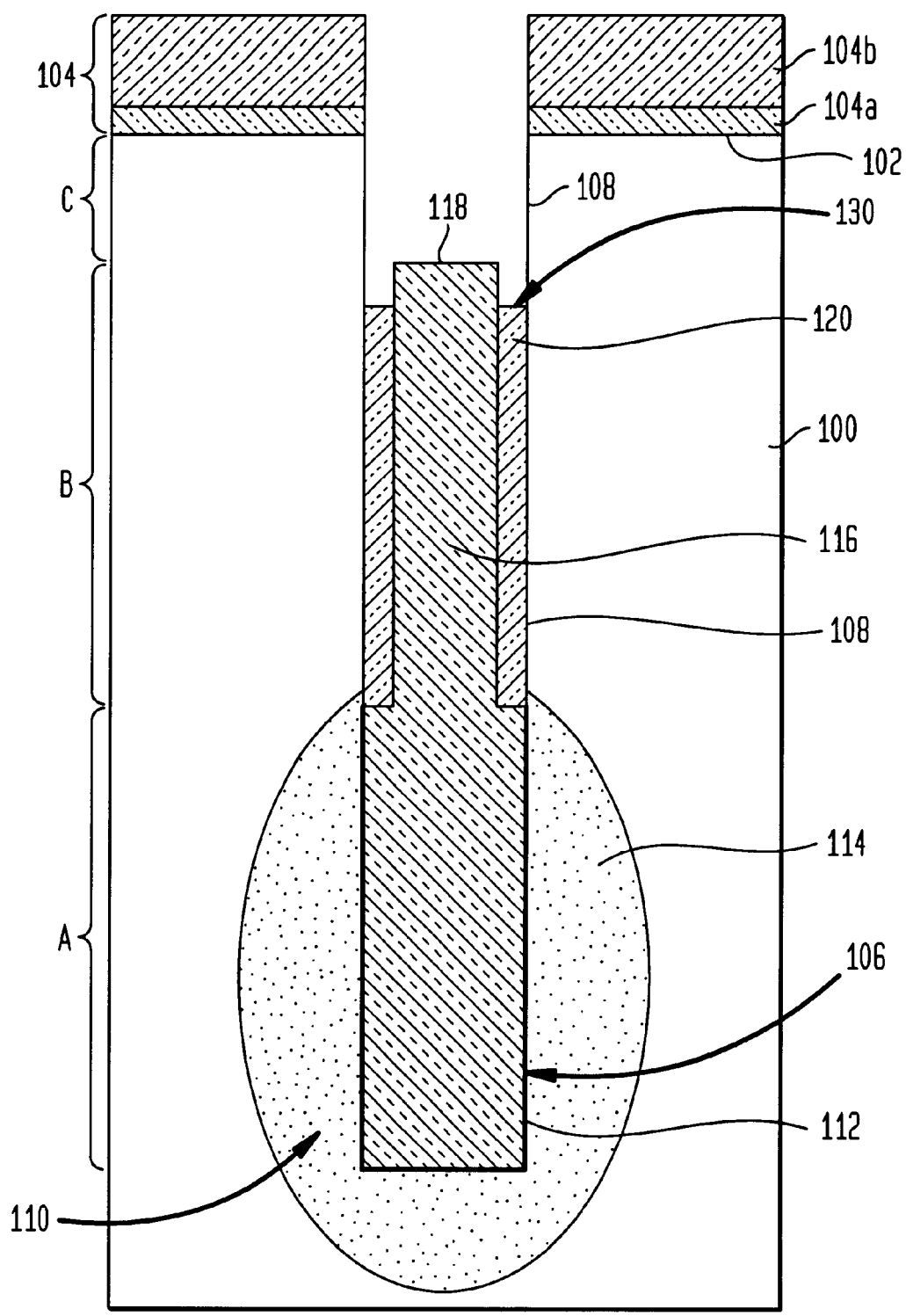
FIGS. 2A–B are schematic cross-sectional views of a semiconductor substrate after additional steps in a process in accordance with an aspect of the invention.

FIG. 2A is a schematic cross-sectional illustration of another step of the process of fabricating a vertical memory cell, wherein the collar 120 is recessed to form a divot 130 on either side of the capacitor fill material 116 below the top surface 118. An etching process ("divot etch") such as RIE may create the divot 130. The etching process may remove the collar 120 from the upper region C and part of the middle region B. By way of example only, the divot 130 may be approximately 40 nm deep by 40 nm wide.

Figure 2B:
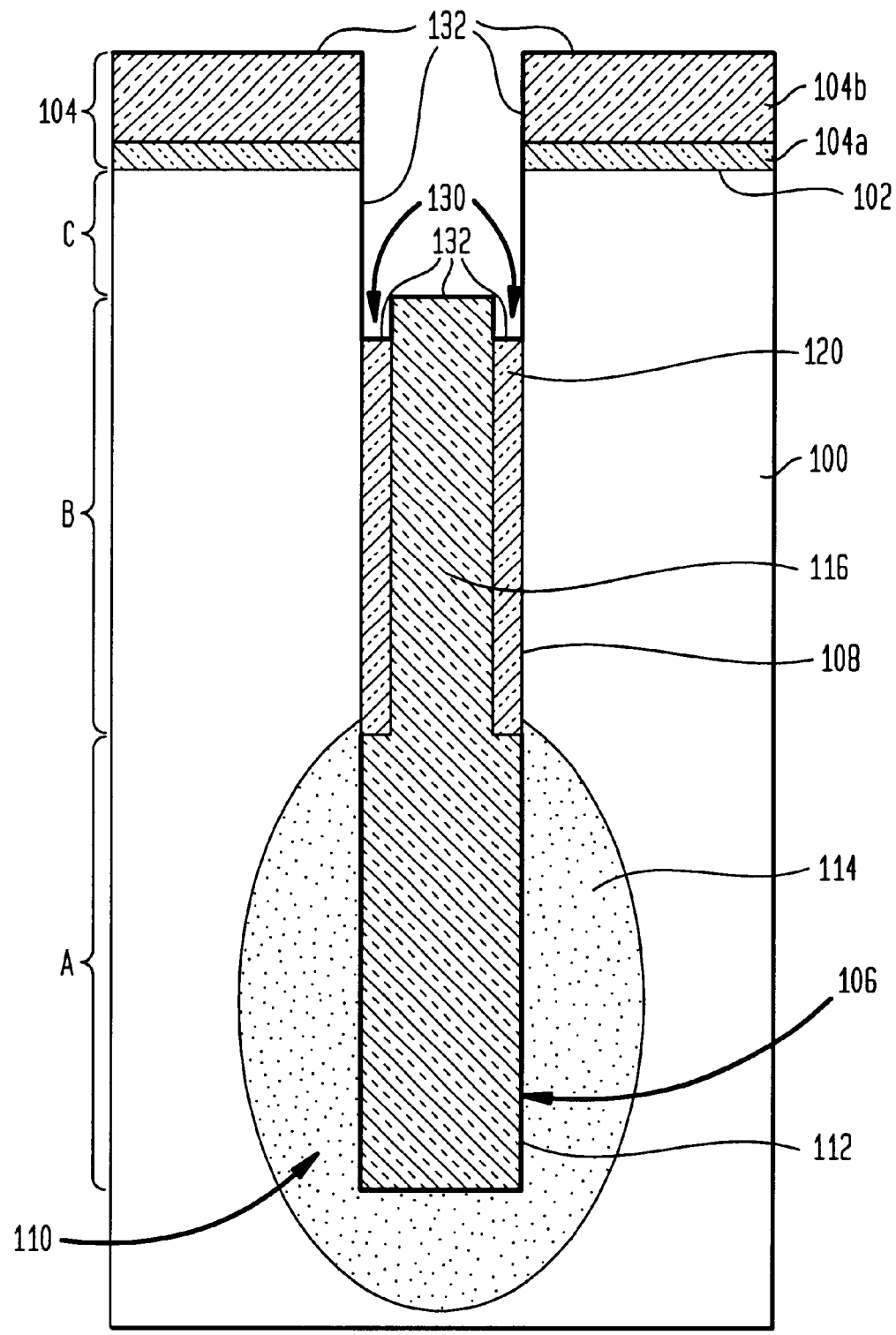

After the divot 130 has been etched, a liner 132 is formed over the divot 130 and any exposed surfaces of the capacitor fill material 116, pad stack 104 and sidewalls 108, as shown in FIG. 2B. The liner 132 is preferably a nitride having a thickness of at least about 22 Å. Preferably, the liner 132 is deposited with a thickness between about 25 Å and 30 Å. Liners below about 22 Å may be unable to prevent dopant from the buried strap (discussed below) from diffusing laterally into the substrate 100, which may cause cross-talk for closely spaced vertical memory cells. Additionally, the liner 132 preferably acts to reduce the resistance of the buried strap, which in turn may have additional benefits such as improving the speed or performance of a vertical memory cell.

Figure 3:
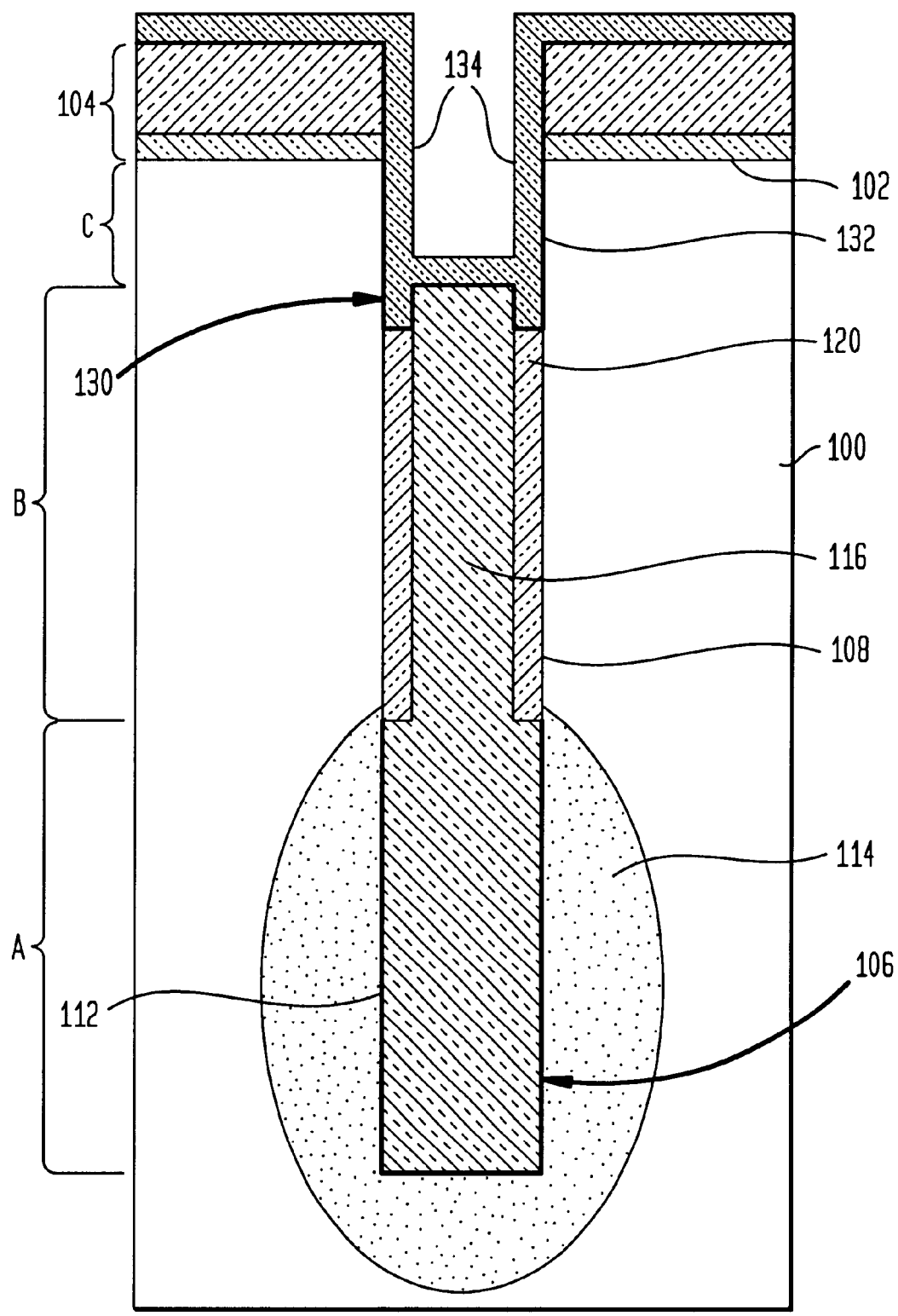
FIG. 3 is a schematic cross-sectional view of a semiconductor substrate after another step in a process in accordance with an aspect of the invention.

After the divot 130 has been etched and the liner 132 has been deposited, the divot 130 is filled with a strap fill material. Preferably, the process of filling the divot 130 with strap fill material includes several precursor steps that will now be explained. As shown in FIG. 3, the divot 130 is initially filled with a spacer 134, which may also coat the exposed liner 132 along the sidewalls 108 and over the pad stack 104. The spacer 134 may be, for example, an oxide. The spacer 134 may be formed by a chemical vapor deposition ("CVD") process such as low pressure CVD ("LPCVD"). In an example, the spacer 134 is between approximately 10 nm and 40 nm thick. In another example, the spacer 134 is at least 20 nm thick.

Figure 4A:
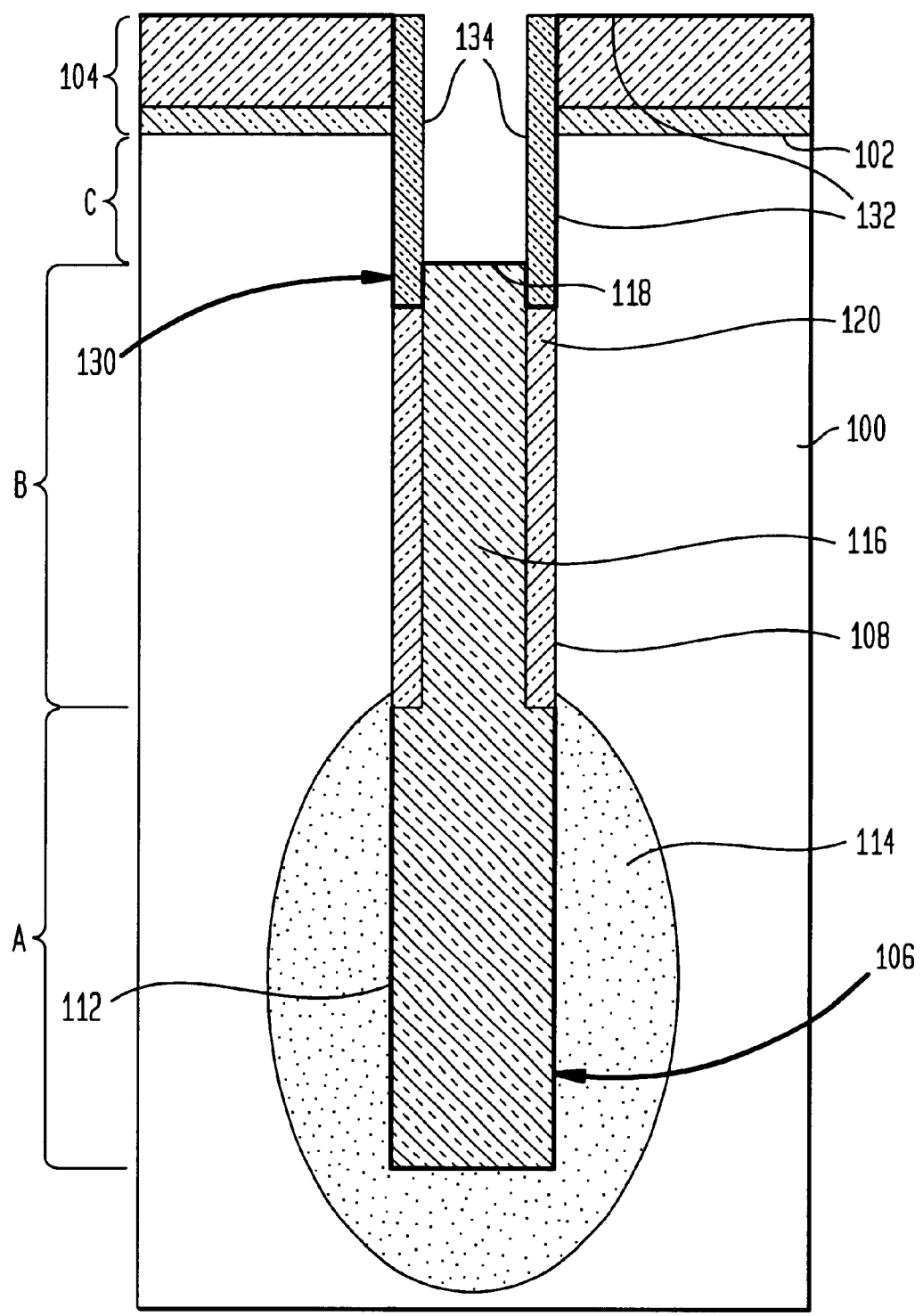

As shown in FIG. 4A, the spacer 134 is preferably removed from the liner 132 covering the top surface 118 and the top of the pad stack 104. The spacer 134 may be removed by RIE or another etching process. Removing the spacer 134 in this manner preferably exposes the nitride liner 132 on horizontal surfaces.

Then, as shown in FIGS. 4B and 4C, the same or a different etching process is continued to "overetch" the spacer 134, thereby removing the liner 132 covering the top surface 118 and the top of the pad stack 104. Preferably, this etching process employs a wet etch that is selective to nitride (e.g., where nitride is removed more quickly than other materials are removed). The "overetch" preferably removes a portion of the spacer 134 and the liner 132 at the interface between the spacer 134 and the capacitor fill material 116. As shown in FIG. 4C, the liner 132 at the interface is partly removed, although the liner 132 may be totally removed from the vertical interface between the spacer 134 and the capacitor fill material 116. Removing the liner 132 in this manner preferably acts to reduce the buried strap resistance.

Continuing the etching process, FIGS. 4D and 4E illustrate the trench 106 wherein the spacer 134 is preferably completely removed from the sidewalls 108 (that are covered by the liner 132). As shown in FIG. 4E, the liner 132 has been recessed below the top surface 118.

Figure 5A:
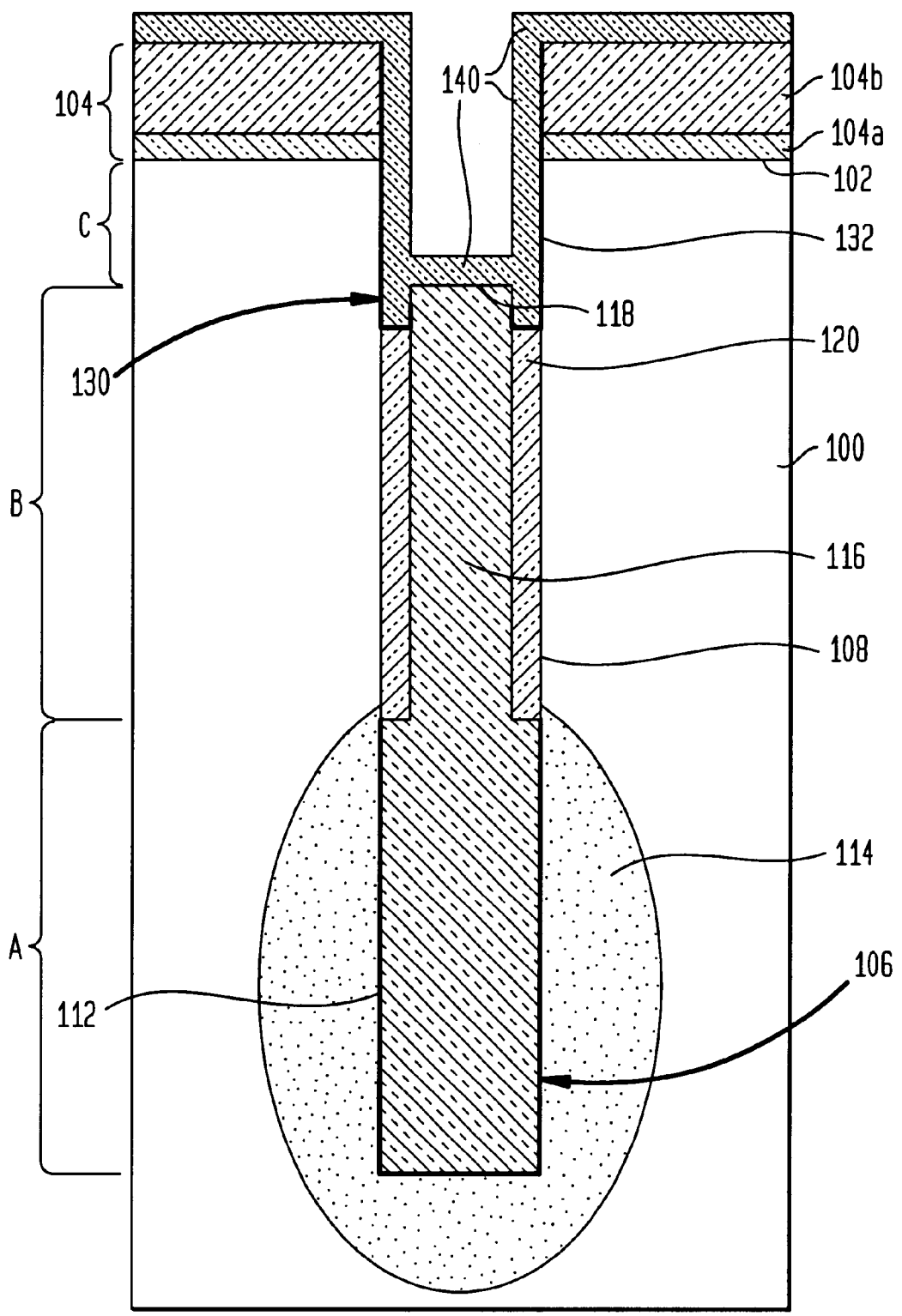
FIGS. 5A–B are schematic cross-sectional views of a semiconductor substrate after additional steps in a process in accordance with an aspect of the invention.

FIG. 5A illustrates another step in the process of forming a vertical memory cell, wherein strap fill material 140 is formed within the divot 130, along the sidewalls 108 lined with the liner 132, and over the top surface 108 and the pad stack 104. The strap fill material 140 is preferably poly-Si, although other semiconductive materials such as silicon germanium ("SiGe") may be used. Optionally, the strap fill material 140 is doped. The dopant may be arsenic, phosphorous, boron or another suitable material. In situ doping, diffusion, soaking or other suitable processes may be employed to add the dopant to the poly-Si. With in situ doping, the dopant and poly-Si are preferably obtained from gasses that are flowed together over the divot 130. In diffusion, the poly-Si is preferably first deposited within the divot 130, and then exposed to a gas containing the dopant at a selected temperature and pressure. Soaking preferably requires deposition of the poly-Si, followed by exposing the poly-Si to the dopant until a coating of a few atomic layers covers the poly-Si. Then the dopant is diffused into the poly-Si by annealing.

Figure 5B:
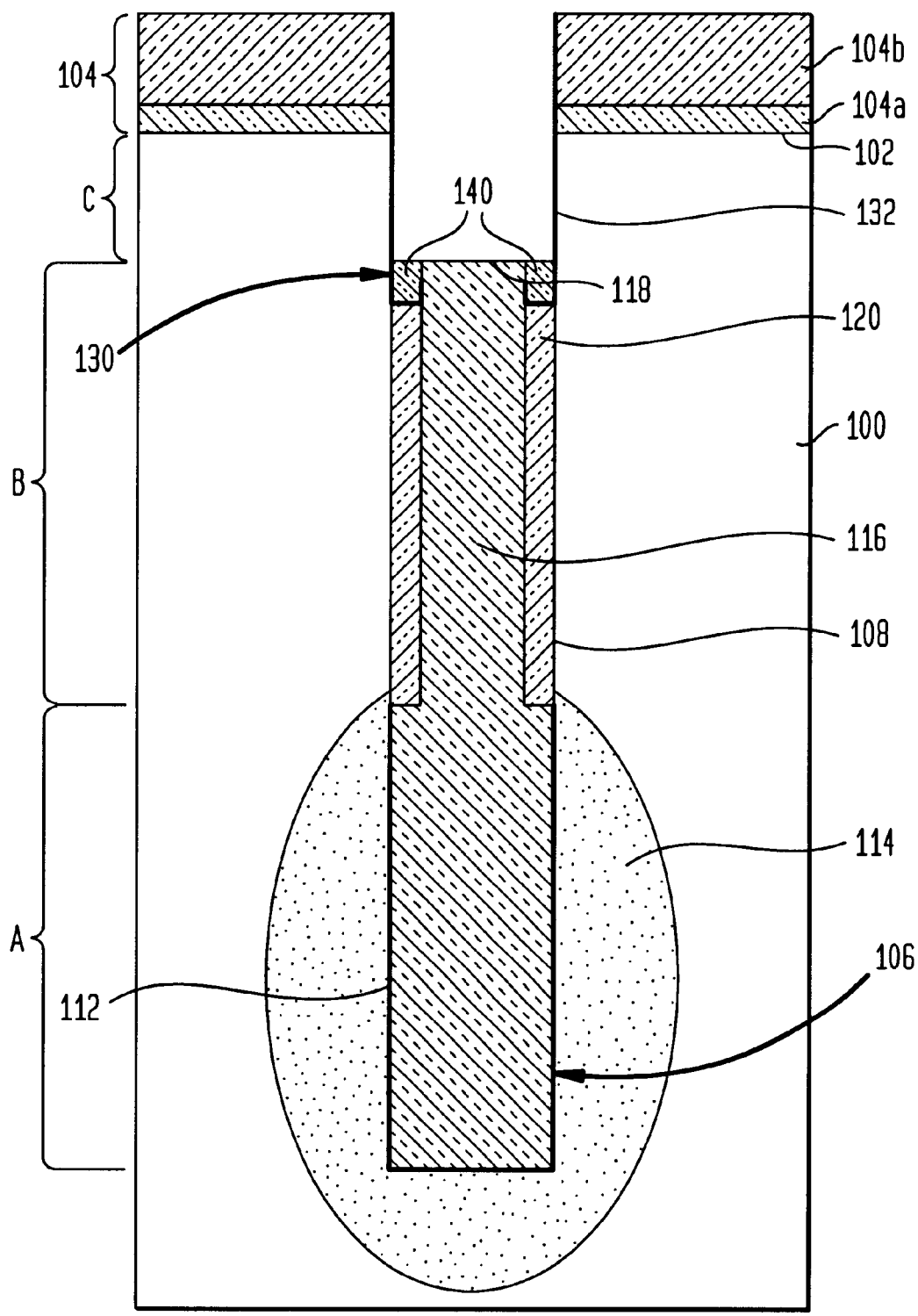

The strap fill material 140 is partially removed after formation. As shown in FIG. 5B, the strap fill material 140 is preferably removed from the pad stack 104, the top surface 118, and along the sidewalls 108 lined with the liner 132. The strap fill material may be removed through an etching process as described above. The strap fill material preferably remains in the divot 130. Optionally, a polysilicon film may be grown over the strap fill material 140 and the top surface 118, preferably by an epitaxial silicon growth process. The epitaxial silicon growth process is preferably performed at a pressure of between approximately 0.05 Torr to 1 Torr. The temperature is preferably within the range of about 500° C. to 850° C. Growing the polysilicon film preferably increases the thickness of the strap fill material 140 and decreases buried strap resistance. The liner 132 acts to prevent growth of polysilicon on the sidewalls 108.

After the strap fill material 140 is formed within the divot 130, an insulator such as a TTO is formed over the divot 130 and the top surface 118 of the capacitor fill material 116. In one embodiment, the insulator is deposited within the trench 106 (as will be explained later in relation to FIG. 12).

Figures 6, 6A:
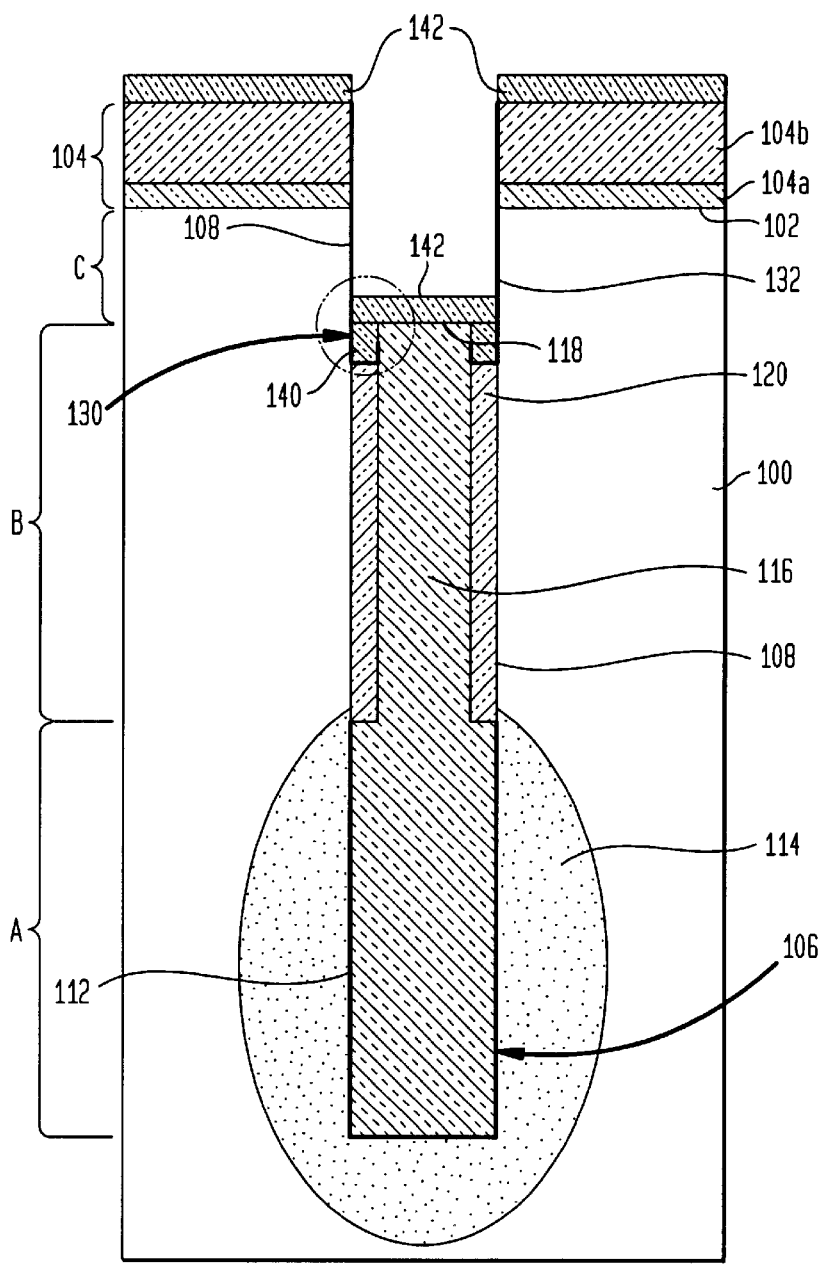
FIGS. 6 and 6A are schematic cross-sectional views of a semiconductor substrate after additional steps in a process in accordance with an aspect of the invention.

In another embodiment, the insulator is preferably formed according to the following steps. A first TTO 142 is deposited as shown in FIG. 6. Preferably, the first TTO 142 covers the pad stack 104, the top surface 118 of the capacitor fill material 116, and the strap fill material 140. FIG. 6A provides a magnified view of the first TTO 142.

Figures 7, 7A:
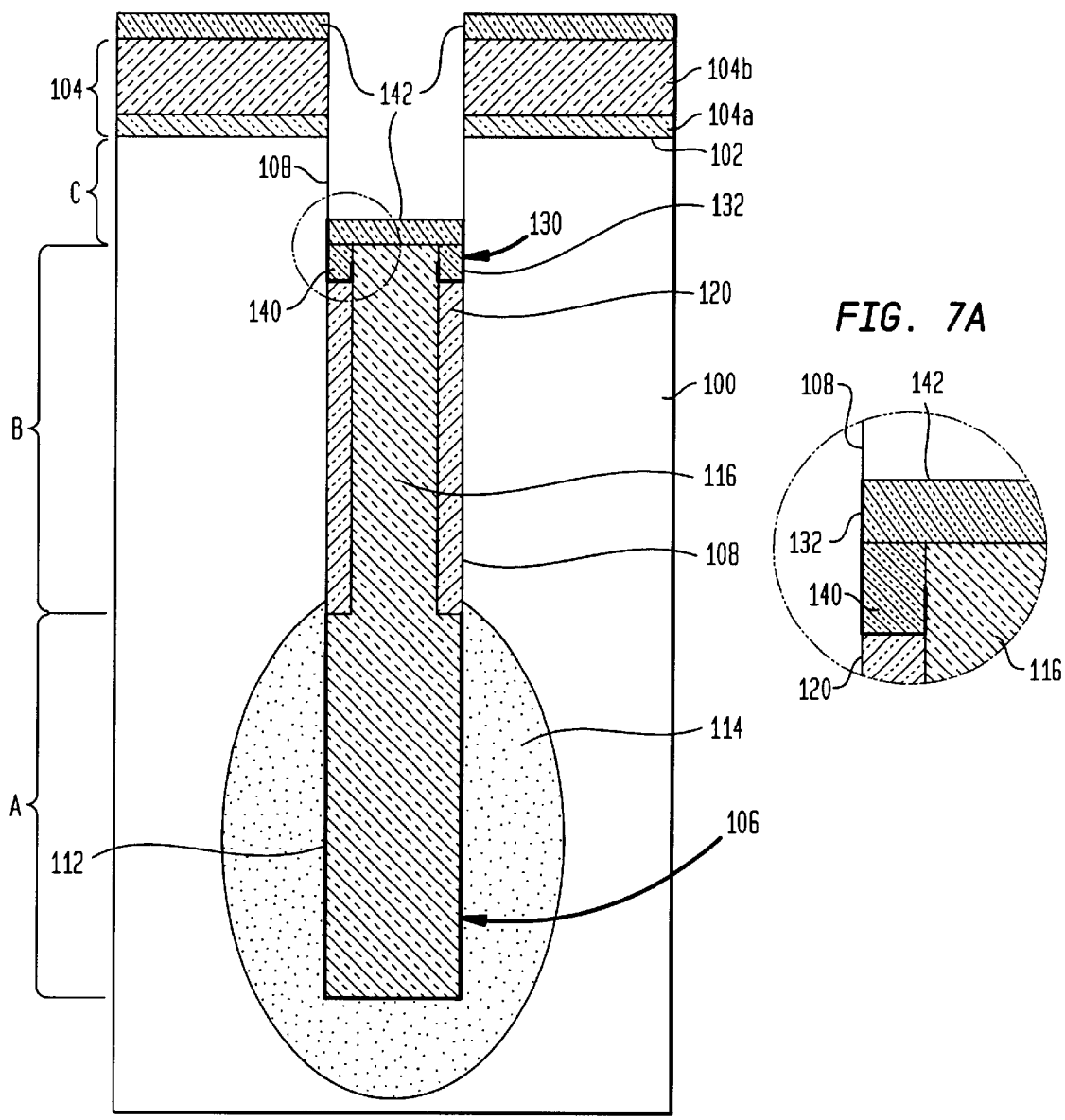
FIGS. 7 and 7A are schematic cross-sectional views of a semiconductor substrate after additional steps in a process in accordance with an aspect of the invention.

Then the liner 132 is preferably removed from the sidewalls 108 in the upper region C, as shown in FIGS. 7 and 7A. The liner 132 preferably remains along the entire exterior surface and bottom surface of the divot 130, and partly along the inner surface of the divot 130 adjacent to the capacitor fill material 116. As will be described in relation to FIG. 13A, the structure of the liner 132 preferably permits out-diffusion of the dopant through the strap fill material 140 in a direction substantially parallel to the sidewalls 108 but reduces out-diffusion in a direction substantially perpendicular to the sidewalls 108, such that cross-talk with a nearby semiconductor device may be eliminated.

Figure 8:
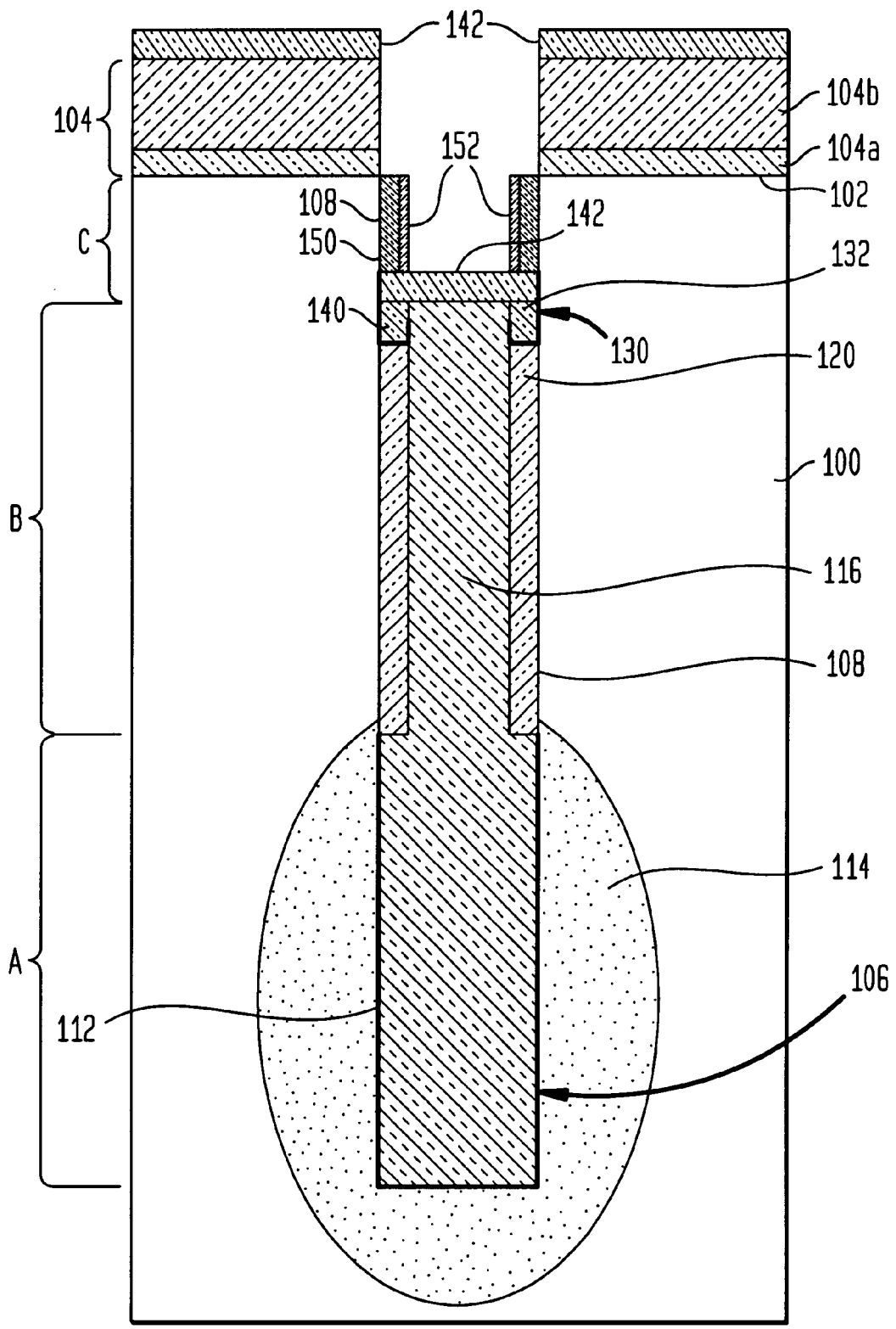
FIG. 8 is a schematic cross-sectional view of a semiconductor substrate after another step in a process in accordance with an aspect of the invention.

FIG. 8 illustrates another step in the process of forming a vertical memory cell, wherein epitaxial Si ("epi-Si") 150 is grown on the exposed trench sidewalls 108 in upper region C. The epi-Si 150 preferably extends from the first TTO 142 to the top of the upper region C. It is desirable to grow the epi-Si 150 because the sidewalls 108 may have defects or may have become damaged or uneven during earlier processing steps. The epi-Si preferably provides a defect-free surface on which a high quality gate oxide may be grown. The epi-Si 150 is also beneficial because it provides a region for the dopant from the capacitor fill material 116 to diffuse into, as will be explained later in relation to FIG. 13. By way of example only, the epi-Si 150 is formed having a thickness between approximately 300 Å and 400 Å. The epi-Si 150 is preferably nitridized, leaving a coating of silicon nitride ("SIN") 152 over the epi-Si 150. The SiN coating 152 acts to protect the epi-Si 150 during further steps of fabricating a vertical memory cell.

Figure 9:
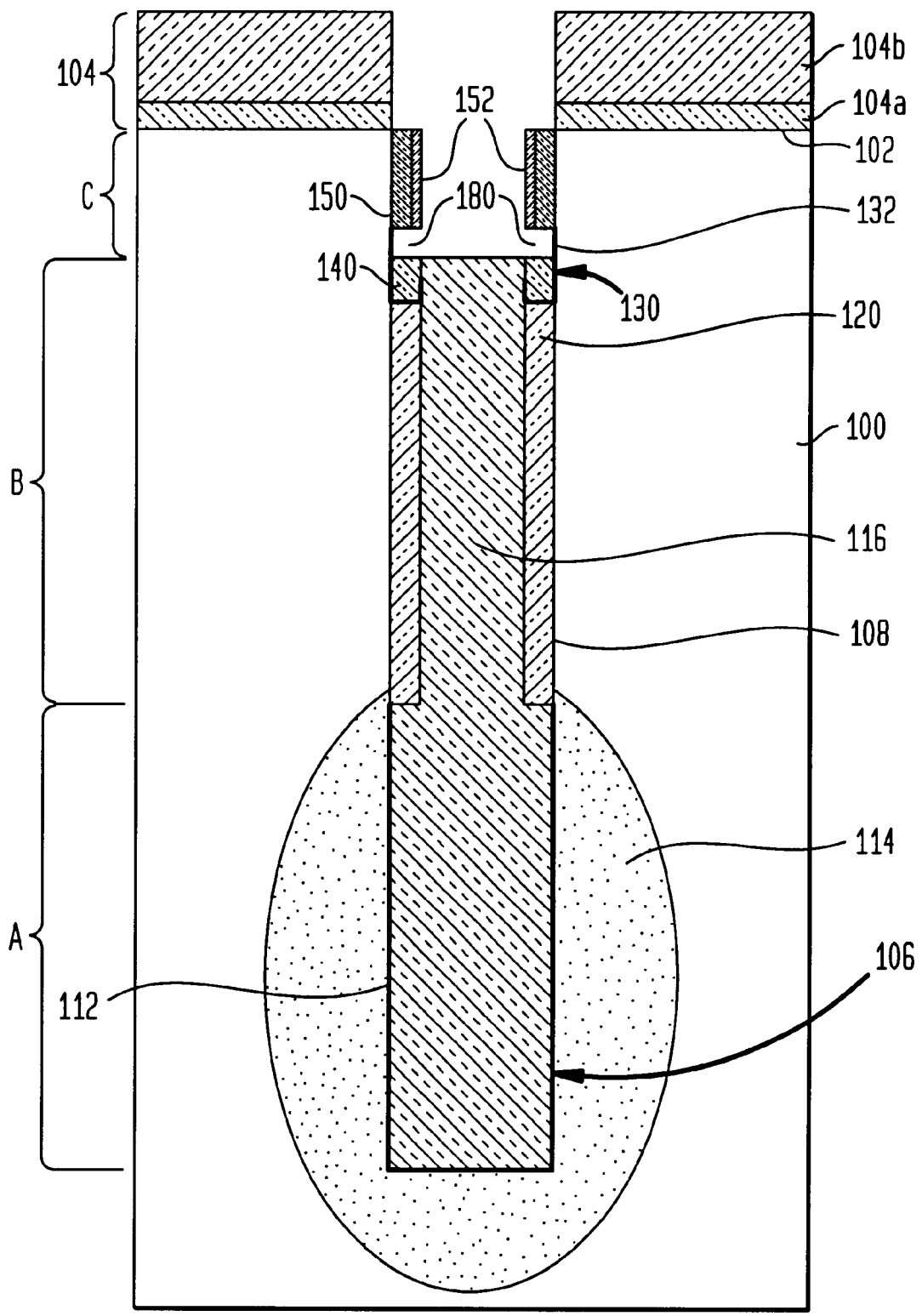
FIG. 9 is a schematic cross-sectional view of a semiconductor substrate after another step in a process in accordance with an aspect of the invention.

In an aspect of the invention shown in FIG. 9, the first TTO 142 is completely removed by, for instance, wet etching. Completely removing the first TTO 142 preferably results in a recess 180 beneath the epi-Si 150 and SiN coating 152.

Figure 10A:
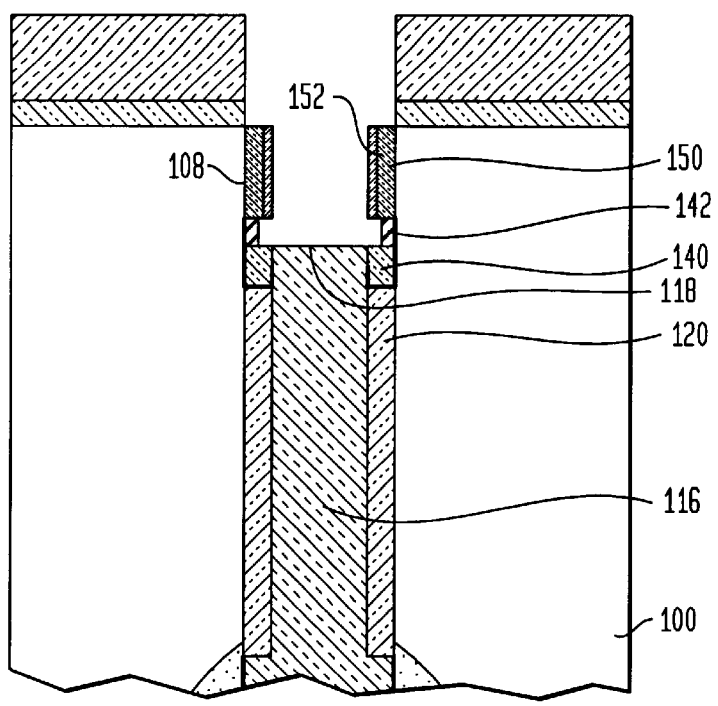
FIGS. 10A–C are schematic cross-sectional views of a semiconductor substrate after additional steps in a process in accordance with an aspect of the invention.
Figure 10B:
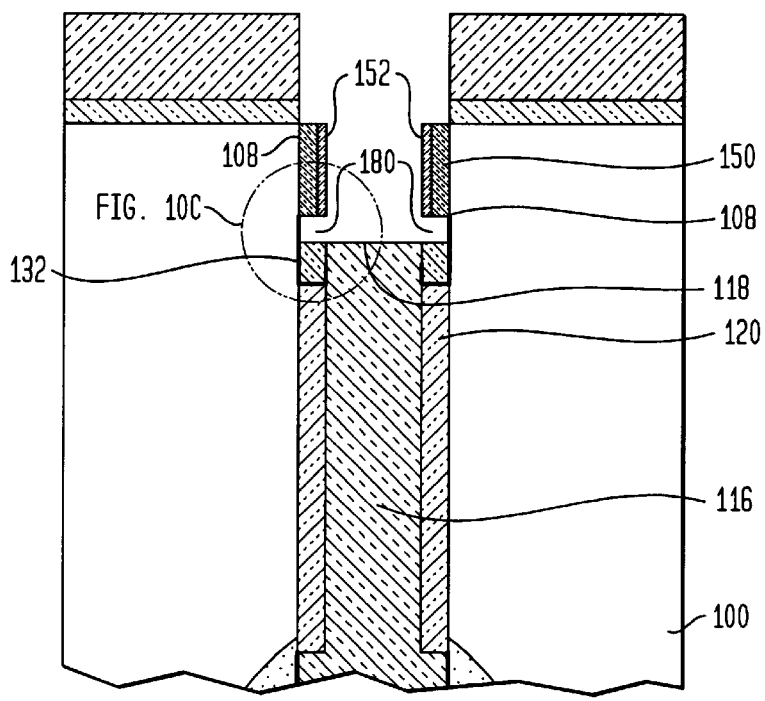
Figure 10C:
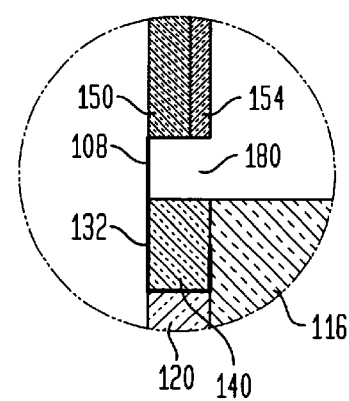

In another aspect of the invention, the first TTO 142 is partially etched by, for example, RIE. FIG. 10A illustrates such a partial etch, wherein a portion of the first TTO 142 beneath the epi-Si 150 remains. Then, the remainder of the first TTO 142 is removed by another etching process, such as wet etching as shown in FIGS. 10B–C to form the recess 180. The two-step removal of first TTO 142 according to FIGS. 10A–B can minimize the etching of other structures (e.g., the strap fill material 140 and the capacitor fill material 116) within the trench 106.

Figure 11A:
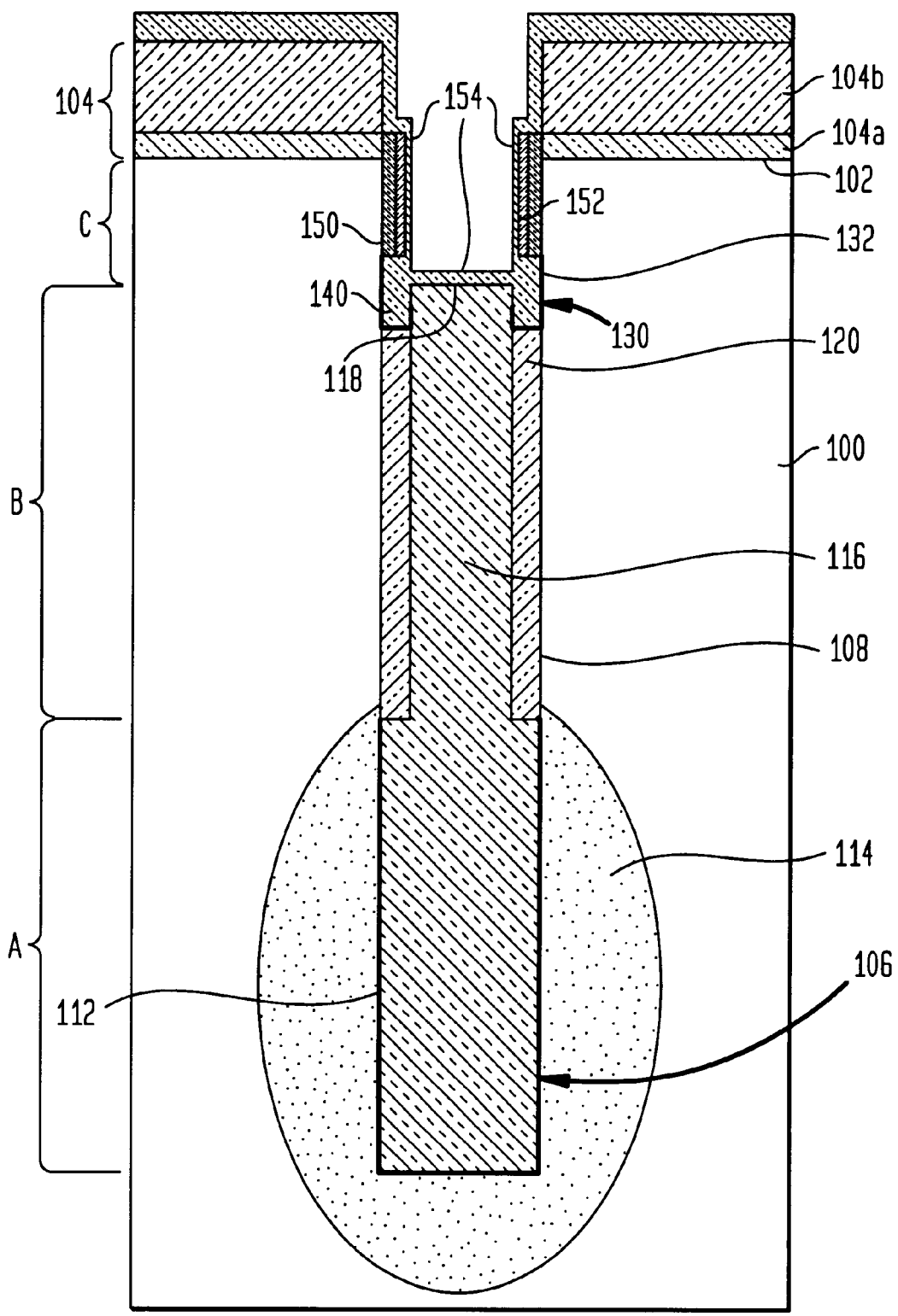
FIGS. 11A–B are schematic cross-sectional views of a semiconductor substrate after additional steps in a process in accordance with an aspect of the invention.
Figure 11B:
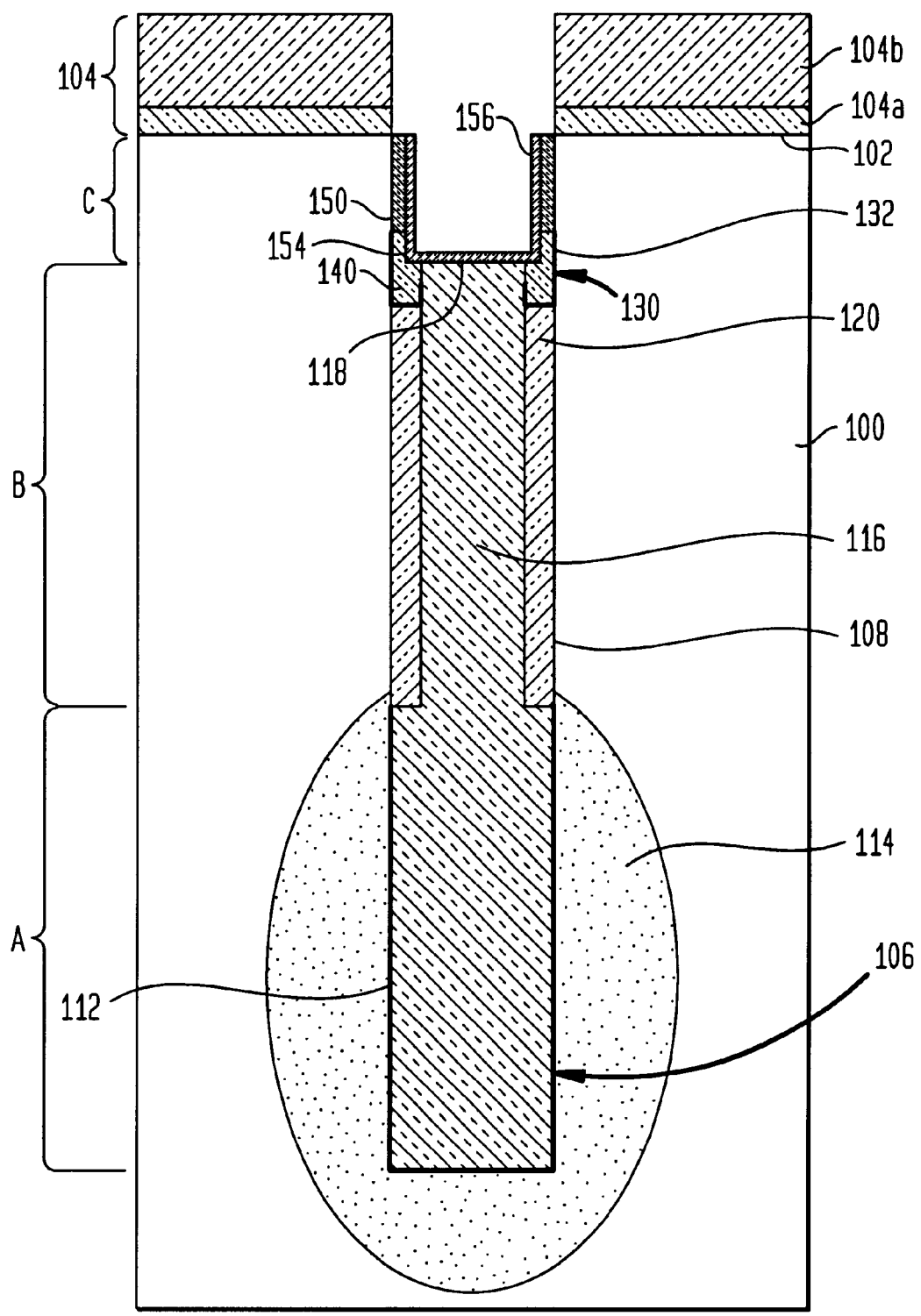

Regardless of the process used to remove the first TTO 142, additional fill material 154 is then deposited in the recess 180 and over the strap fill material 140. Preferably, the additional fill material 154 comprises the same material as the strap fill material 140. As shown in FIG. 11A, the additional fill material 154 may be deposited over exposed surfaces within the trench 106 and on top of the pad stack 104. As shown in FIG. 11B, the additional fill material 154 is preferably etched so that it remains only along the liner 132 and on top of at least part of the strap fill material 140. The SiN coating 152 is preferably removed after this etching process. A sacrificial layer 156 is formed along the exposed surfaces of the trench 106, including the epi-Si 150, the top surface 118, the strap fill material 140 and the additional fill material 154. Preferably, the sacrificial layer 156 is an oxide.

Figure 12:
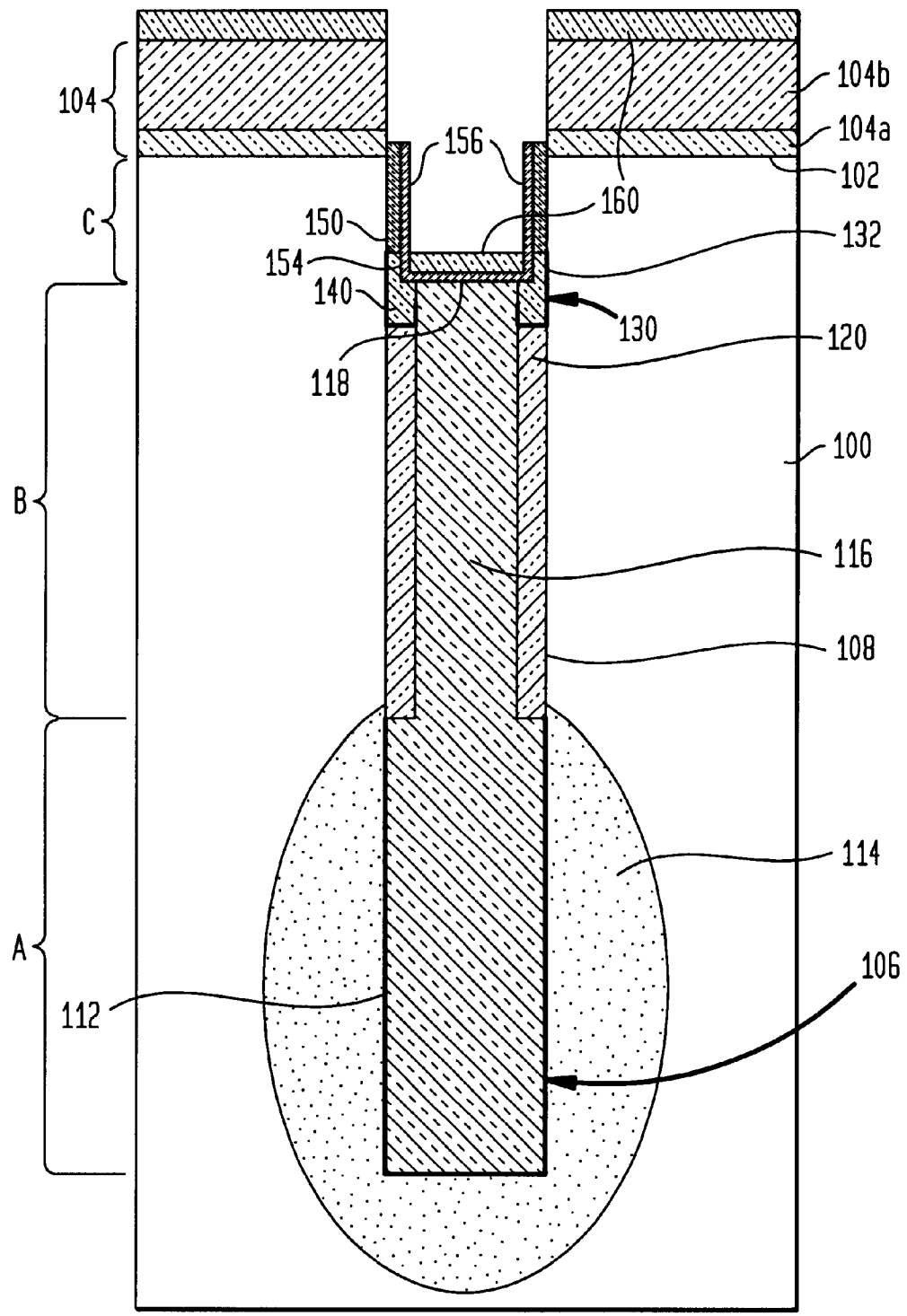
FIG. 12 is a schematic cross-sectional view of a semiconductor substrate after another step in a process in accordance with an aspect of the invention.

FIG. 12 illustrates another step in the process of forming a vertical memory cell, wherein an insulator 160 (e.g., TTO) is deposited or otherwise formed within the trench 106 along the bottom of the upper region C. The insulator 160 preferably covers the sacrificial layer 156 that is on the top surface 118 of the capacitor fill material 116, the strap fill material 140, and any additional fill material 154.

The process of forming a vertical memory cell preferably continues as shown in FIG. 13, wherein the sacrificial layer 156 is preferably removed from the epi-Si 150. A gate oxide 170 may be grown on the epi-Si 150. Then a final fill material 172 is deposited or otherwise formed in the remainder of the trench 106, covering the insulator 160 and the gate oxide 170. The final fill material 172 is preferably arsenic doped poly-Si, and may have the same composition and structure as the capacitor fill material 116.

As shown in the enlarged view of FIG. 13A, dopant from the capacitor fill material 116 is permitted to diffuse along a path D. The path D may be affected by the thickness and structure of the liner 132. The path D preferably provides dopant diffusion in a direction substantially parallel to the sidewall 108, while minimizing diffusion in a direction perpendicular to the sidewall 108. The dopant may diffuse through the buried strap and into the epi-Si 150 as part of the path D. Returning to FIG. 13, after the gate oxide 170 is grown and the final fill material 172 is deposited, further processing steps may then be performed to complete formation of a vertical memory cell.

One advantage of the present invention is the semiconductor device includes a buried strap providing reduced horizontal out-diffusion The reduced out-diffusion minimizes the possibility for cross-talk between nearby semiconductor devices. Another advantage of the present invention is that the thickness of the liner reduces the resistance of the buried strap. Yet another advantage of the present invention is the growth of epi-Si on exposed trench sidewalls. The epi-Si provides a relatively defect-free surface on which the gate oxide is grown. A further advantage of the epi-Si is that it provides a region for the dopant to diffuse into from the capacitor fill material. The buried strap, liner and epi-Si may be used in structures other than trench memory cells, including planar memory cells and other semiconductor devices.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device comprising:

forming a trench in a semiconductor substrate, the trench having a sidewall;

forming a collar along the sidewall;

forming a capacitor, the capacitor including a capacitor fill material having a dopant, the capacitor fill material being formed in a region of the trench;

recessing the collar to form a divot, wherein a top portion of the collar is recessed below a top surface of the capacitor fill material; and forming a buried strap including a liner within the divot, whereby the dopant is operable to diffuse through the buried strap in a direction substantially parallel to the sidewall, and the liner acts to reduce diffusion of the dopant in a direction substantially perpendicular to the sidewall.

2. The method of fabricating a semiconductor device of claim 1, wherein the buried strap further includes a strap fill material, and the liner has a first side disposed adjacent to the sidewall and a bottom connected to the first side and disposed over the top portion of the collar.

3. The method of fabricating a semiconductor device of claim 1, wherein the liner is at least about 22 Å thick.

4. The method of fabricating a semiconductor device of claim 3, wherein the liner is between about 25–30 Å thick.

5. The method of fabricating a semiconductor device of claim 2, wherein the liner includes a second side connected to the bottom and disposed between a portion of the strap fill material and the capacitor fill material.

6. The method of fabricating a semiconductor device of claim 5, wherein the second side is connected to the bottom.

7. A method of manufacturing a semiconductor device, the method comprising:

forming a trench in a semiconductor substrate, the trench having a sidewall defining lower, middle and upper regions;

forming a node dielectric along the sidewall in the lower region of the trench;

forming a collar along the sidewall in the middle and upper regions of the trench;

substantially filling the lower and middle regions with a capacitor fill material, the capacitor fill material comprising polysilicon and a dopant and having a top surface;

etching a top portion of the collar below the top surface of the capacitor fill material to form a divot;

depositing a nitride liner within the divot, the nitride liner having a thickness of at least about 22 Å; and forming a strap fill material within the nitride liner of the divot, wherein the strap fill material and the nitride liner form a buried strap, and the nitride liner permits diffusion of the dopant in direction substantially parallel to the sidewall and acts to reduce diffusion of the dopant in a direction substantially perpendicular to the sidewall.

8. The method of manufacturing a semiconductor device of claim 7, wherein the divot includes a first face adjacent to the sidewall, a second face connected to the first face and disposed over the top portion of the collar, and a third face disposed between the strap fill material and the capacitor fill material, wherein the third face extends from the second face to the top surface of the capacitor fill material.

9. The method of manufacturing a semiconductor device of claim 8, further comprising:

filling the divot with a spacer after depositing the nitride liner; and etching the spacer from the divot; and removing part of the third face of the nitride liner so that the third face extends from the second face to a point below the top surface of the capacitor fill material.

10. The method of manufacturing a semiconductor device of claim 7, wherein the strap fill material comprises polysilicon.

11. The method of manufacturing a semiconductor device of claim 7, further comprising forming a layer of epitaxial silicon on the sidewall adjacent to the strap fill material.

* * * * *